(12) United States Patent
Maxey et al.

(10) Patent No.: US 6,380,593 B1
(45) Date of Patent: Apr. 30, 2002

(54) AUTOMATED WELL-TIE AND SUBSTRATE CONTACT INSERTION METHODOLOGY

(75) Inventors: Jay Maxey, Garland; Kevin M. Ovens, Plano; Clive Bittlestone, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,665

(22) Filed: Dec. 15, 1999

Related U.S. Application Data
(60) Provisional application No. 60/114,189, filed on Dec. 30, 1998.

(51) Int. Cl.$^7$ .............................................. G06F 15/00
(52) U.S. Cl. ......................... 257/371; 257/372; 364/491
(58) Field of Search .................... 395/500.13, 500; 364/488, 489, 490, 491, 578; 257/371, 372; 357/23.5, 23.9; 250/332

(56) References Cited

U.S. PATENT DOCUMENTS

| 5,021,847 A | * | 6/1991 | Eitan et al. ................... 357/23 |
| 5,726,902 A | * | 3/1998 | Mahmood et al. .......... 364/489 |
| 5,737,236 A | * | 4/1998 | Maziasz ..................... 364/490 |
| 5,764,533 A | * | 6/1998 | DeDood ..................... 364/491 |
| 5,984,510 A | * | 11/1999 | Guruswamy et al. ....... 364/491 |
| 6,006,024 A | * | 12/1999 | Guruswamy et al. ....... 395/500 |

* cited by examiner

*Primary Examiner*—Olik Chaudhuri
*Assistant Examiner*—Laura Schillinger
(74) *Attorney, Agent, or Firm*—Robert D. Marshall, Jr.; W. James Brady, III; Frederick J. Telecky, Jr.

(57) ABSTRACT

A modified flow for ASIC place an route software flow which allows incorporation into the flow, a process for tracking the locations of substrate contacts and well-ties within and outside the boundaries of placed cells and generating required supplemental placements, making possible an efficient use of silicon chip area expended in the adequate placement of substrate contacts and well-ties.

15 Claims, 7 Drawing Sheets

| TECHNOLOGY | SIZE TRACKS | SIZE TRACKS AFTER SUB-WELL REMOVED | ACTUAL SIZE MICRONS | # CELLS | EXAMPLES |
|---|---|---|---|---|---|
| 0.6 MICRON | 11 | 11 | 20.4 | 136 | FLIP-FLOPS, ADDERS, MUXES |
| 0.6 MICRON | 6 | 5 | 10.2 | 36 | |
| 0.6 MICRON | 4 | 3 | 6.8 | 6 | INVERTER, 2-INPUT NAND |

AUTOMATED WELL-TIE AND SUBSTRATE CONTACT INSERTION METHODOLOGY

This application claims priority under 35 USC §119(e)(1) of Provisional Application No. 60/114,189, field Dec. 30, 1998.

TECHNICAL FIELD OF THE INVENTION

The technical field of this invention is integrated circuit manufacture and more particularly to effective placement of substrate contacts and well-tie contacts within standard cell type Application Specific Integrated Circuits.

BACKGROUND OF THE INVENTION

Application specific integrated circuit (ASIC) chips may be divided roughly into two major classes, gate-array circuits and standard cell circuits. Gate Array circuits are formed from a 'base-bar' in which all the wafer processing steps up to, but not including, the contact opening step are common to every finished circuit (perhaps hundreds of unique finished circuit functions for hundreds of customers) in every detail of the active devices and their first level of interconnect. Only the contact, via, and metal level masks are unique to a given finished circuit function.

Standard Cell circuits, on the other hand consist of placements of 'standard cell library' elements (a NAND gate would be an example) which are interconnected by employing a set of custom designed contact, via, and metal level masks to complete the over-all circuit function connections. All mask levels are unique to a given finished circuit function except for the case where a finished circuit function application might have several slightly differing circuit options required.

This invention relates to the solution of a problem which arises in the design of standard cell circuits, wherein cell standardization limits the efficient use of silicon chip area, and consequently, limits the ability to reduce chip costs by reducing chip area. Specifically, the invention relates to the effective placement of substrate contacts and well-tie contacts within the overall circuit function.

Typically, a conventional standard cell library is generated by an engineer who designs the electrical cell and simulates it extensively to verify full adherence to cell specifications. The cell is then implemented in the layout of a mask set for that cell which conforms strictly to a set of 'layout rules'. The successful fabrication of an ASIC product depends on a quality mask set which has been generated following every detail of the 'layout rules' for the specific fabrication process being used and obviously depends on the quality of the fabrication process, namely, how well each step is controlled. Toward that end, the design is subjected to extremely intense scrutiny by the use of a computer software verification program which analyzes the design for full compliance to all 'layout rules'.

Layout rules generally contemplate several aspects of the fabrication process and also contemplate the aspects of device usage. In the first area, the fabrication process, it is clear that, as an example, there is a limit to the smallest size of a contact opening. There is also a limit to the spacing between adjacent openings to be made on a given mask level. In the second area, regarding device usage, other factors influence 'layout rules'. A major example of this, and the specific concern of this invention, is the rule regarding the number of substrate contacts and well-ties must be placed within a given chip area or along a given linear direction on the chip.

It is well known that the quality of the isolation between separate components in a circuit depends on the isolation quality of the reverse biased P-N junction diode which separates these components. Circuit requirements demand that the quality of this isolation between components be acceptable even when the isolating diode has almost zero reverse bias voltage applied. Any current flow, parasitic or otherwise, must not be allowed to cause isolation diodes to become forward biased, in which case the isolation effectiveness degrades sharply.

For this reason the contact openings which bias the specific areas in question, are controlled as to the number required in a linear dimension by the layout rules. This control, for example, the maximum separation of substrate contacts in a linear dimension, or the maximum separation of well-ties in a given linear dimension is specified by two layout rules. More precisely, a given process will conventionally have layout rules stating (as an example only):

| | |
|---|---|
| Maximum separation between substrate contacts | 75 microns |
| Maximum separation between well-tie contacts | 75 microns |

In a process using standard cells, the typical sequence of design steps is roughly as follows:

A netlist is generated which gives a detailed connection of each of the cells to be used and their detailed connection to one another and to the periphery of the chip.

A software router designs the placement and metal level routing between each and every placement.

The engineer reviews the software generated place-and-route details and interacts with the software to optimize the circuit in one or more repeat passes.

In such an automated environment, it is obviously necessary to limit the decisions which the Software Router must make to those as simple conceptually as possible. This is because the software router has an enormously complex problem to solve to start with, and burdening it with additional computer decisions merely adds to design cycle time and cost.

Consequently, the issue of maximum substrate contact spacing and maximum well-tie contact spacing is normally solved at a lower level in the design, namely at the cell design level. If the contacts required are built into the cells themselves, then the router merely needs to contend with the simpler problem of substrate contact and well-tie spacing in the inter-cell regions. This is much simpler, in general, than incorporating the full adherence to the rule into the router function. Irrespective of the techniques used to determine the number of and placement of substrate contacts and well-ties, the verification software will be used for final certification that the design has met the required criteria.

Unfortunately, solving the substrate and well-tie placement problem at the cell level results in much redundancy, and these contacts become much more numerous and wasting of space than would be the case if they were placed only where absolutely necessary to meet the maximum separation limit. The present invention strikes an efficient compromise based on the statistics of analysis of a variety of design examples. The resulting requirement placed on the router in placing these contacts increases, but only incrementally, and the chip size saving is a clear advantage.

SUMMARY OF THE INVENTION

This invention is a methodology supplementing the software router flow in a standard cell based ASIC flow in order to improve layout density of the finished chip function. The density improvement results from a revised approach to obtaining adherence to two crucial layout rules regarding (1) the maximum allowed separation between substrate contacts and (2) the maximum allowed separation between N-well-ties. First, based upon an analysis of a variety of designs having a full complement of substrate and well-tie contacts in the basic cell, certain cells are identified which could be gainfully redesigned with such contacts removed. The size of the redesigned cells is reduced in this manner by a significant percentage. When these redesigned cells are used in a modified implementation of the chip, the router supplemented by the methodology of this invention, achieves a smaller lower cost chip layout and the simple modification to build back into the chip layout any substrate or well-tie contacts needed is a relatively straightforward modification of the overall chip layout flow.

BRIEF DESCRIPTION OF THE DRAWINGS

These and other aspects of this invention are illustrated in the drawings, in which.

DETAILED DESCRIPTION OF PREFERRED EMBODIMENTS

Figures 1, 3:
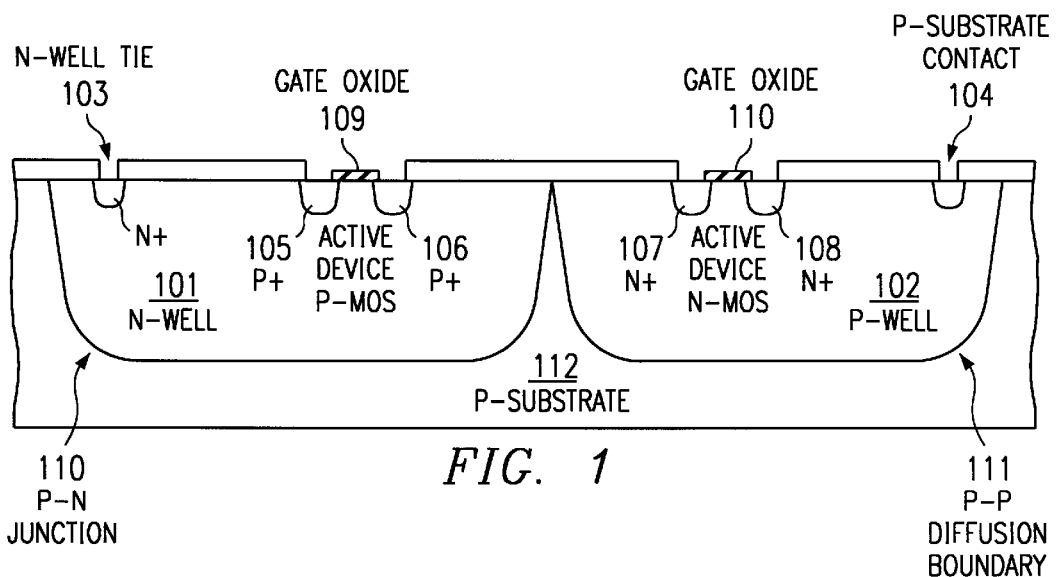
FIG. 1 illustrates the vertical device structure for conventional ASIC devices showing N-Well and P-Well regions, and P-Channel and N-Channel transistors embedded in these respective areas.
FIG. 3 illustrates the number of cells and some example cell types in three separate size ranges for a conventional ASIC standard cell library.

Conventional ASIC device structures are fabricated in P-type substrates with two wells diffused into bulk areas of the silicon. The first, a P-well is included to give the P-regions a well controlled doping level for the N-channel devices which are in turn isolated from each other by tying the P-well (by means of a substrate contact) to the lowest circuit voltage potential (zero volts, also labeled $V_{SS}$), and the second, an N-well which forms the region in which P-channel devices are fabricated and which are in turn isolated from one another by tying the N-well (with a well-tie) to the highest circuit voltage potential (normally +3 to +5 volts, also labeled $V_{DD}$). This device structure with the regions for the P-channel and N-channel transistors illustrated along with the N-well contacts (well-ties) and P-well contacts (substrate contacts) is shown in FIG. 1.

The N-well diffused region 101 creates a p-n junction at boundary 110 but the P-well diffusion 102 creates only a P-P diffusion boundary with no p-n junction at boundary 111 and the P-well is a continuous path to the P-substrate 112. N-well tie is illustrated by 103 and a P-substrate contact is illustrated by 104. Drain-source regions for P-MOS devices are illustrated by 105 and 106, and drain-source regions for N-MOS devices are illustrated by 107 and 108. Gate oxide regions are shown in 109 and 110.

Figure 2:
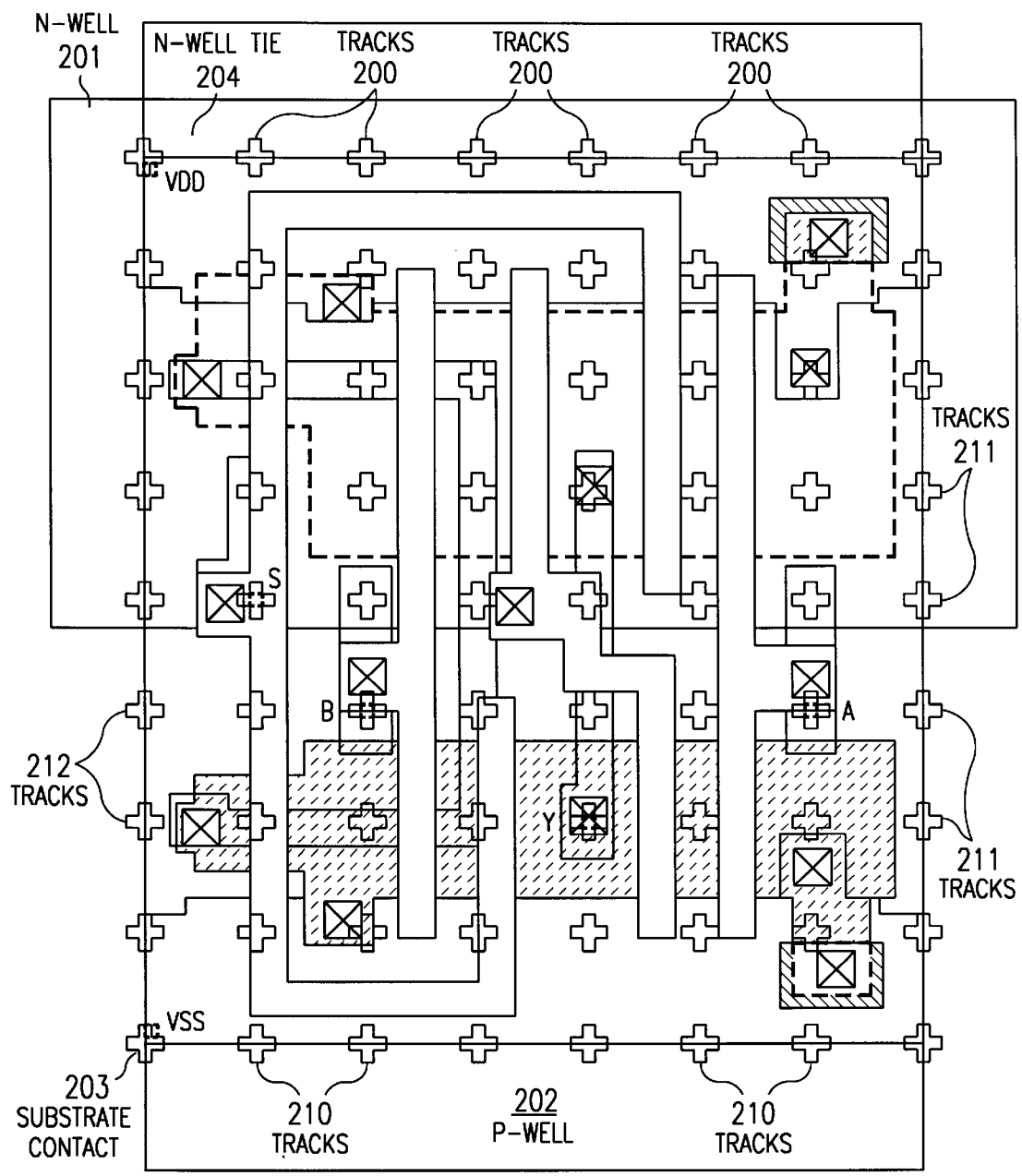
FIG. 2 illustrates an example of grid placement of cells at specific tracks locations within the silicon chip area.

In order to give regularity to cell placements in a given design, the conventional ASIC flow defines a grid for the layout which consists of regularly spaced tracks. These track spacings must be adhered to in cell layout so that there is a unique position to the placement of a cell along these tracks and there is a set of rules governing the overall place and route protocol. An example of tracks as they appear on a conventional layout plot is given in FIG. 2. FIG. 2 illustrates tracks 200, 210, 211 and 212, N-well 201, P-well 202, P-well substrate contact 203 and N-well tie 204.

Commercially available routers are designed to adhere to the detail requirements of each ASIC designer or ASIC manufacturer. Two popular examples of such routers are the Cadence Router and the Avanti Router which are highly flexible in the parameters of the place and route implementation so as to be conformable to the needs of the specific user.

FIG. 3 illustrates the number of cells and some example cell types in three separate size ranges for a conventional Texas Instruments ASIC standard cell library in use today. Statistics can be readily generated to show that a typical design contains many two-input NAND gates and inverters and also correspondingly high usage of certain simple flip-flops and MUXes. One recent study showed that for a combined five designs containing ~220,000 gates about 55,000 gates were cells of four grids. Obviously a chip area reduction strategy which gleans savings from these cells in particular will have a significant impact on the layout density. These statistics, furthermore, are clearly useful in determining a place and route strategy which conserves silicon area in the placement of substrate contacts and well-ties as will be seen in the information to follow.

Figure 4:
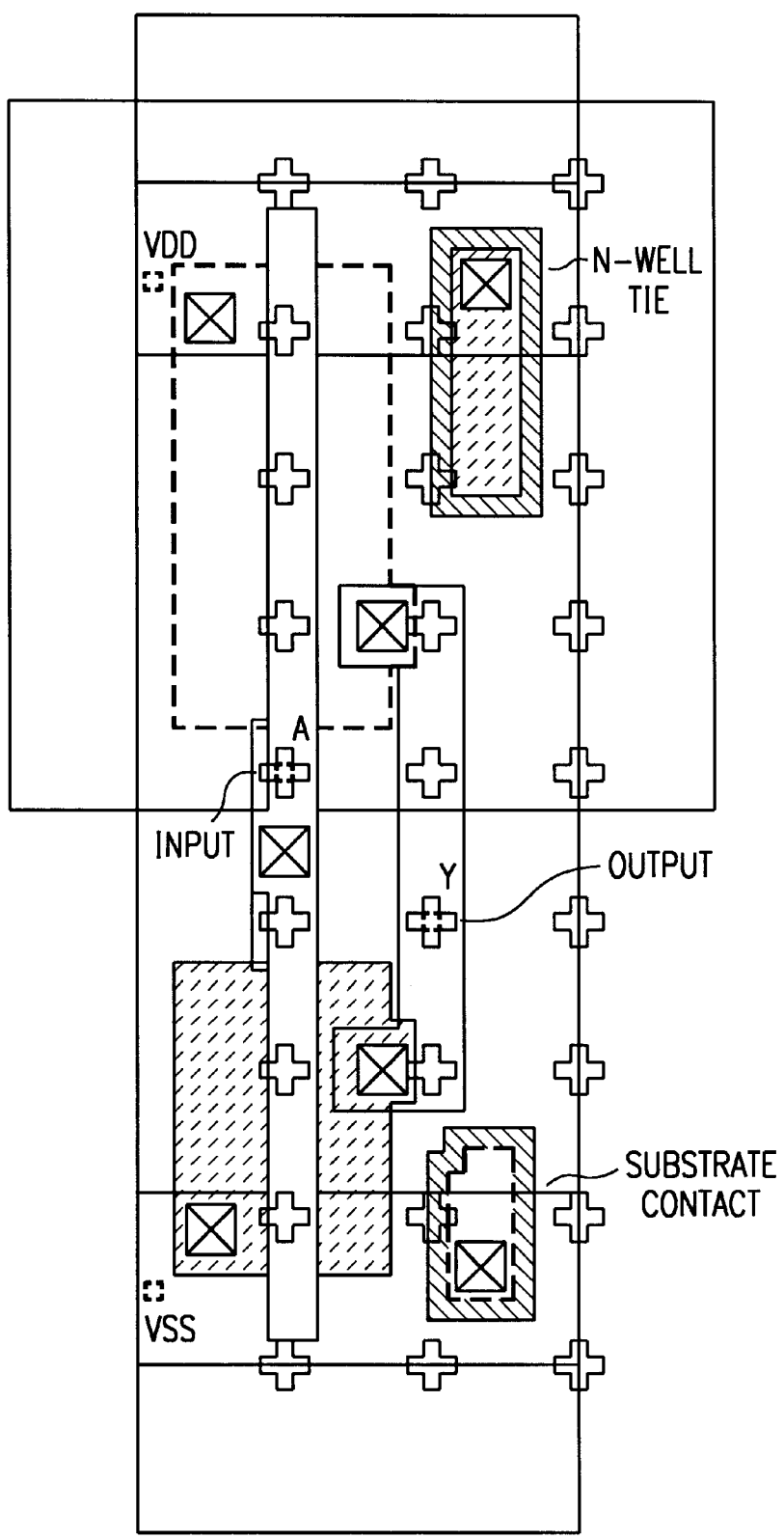
FIG. 4 illustrates an inverter cell layout of a conventional standard cell library.
Figure 5:
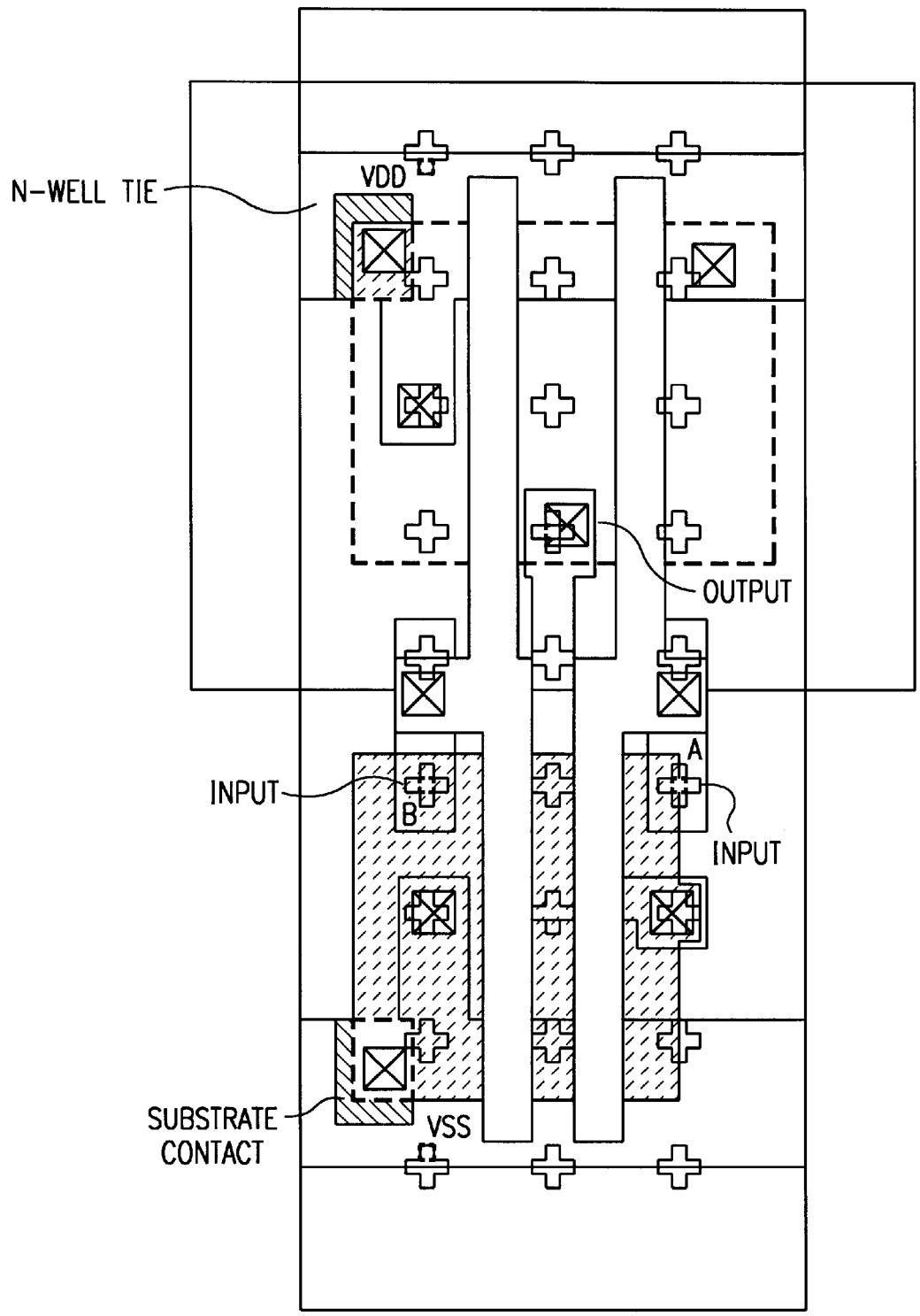
FIG. 5 illustrates a two-input NAND gate cell layout of a conventional standard cell library.
Figure 6:
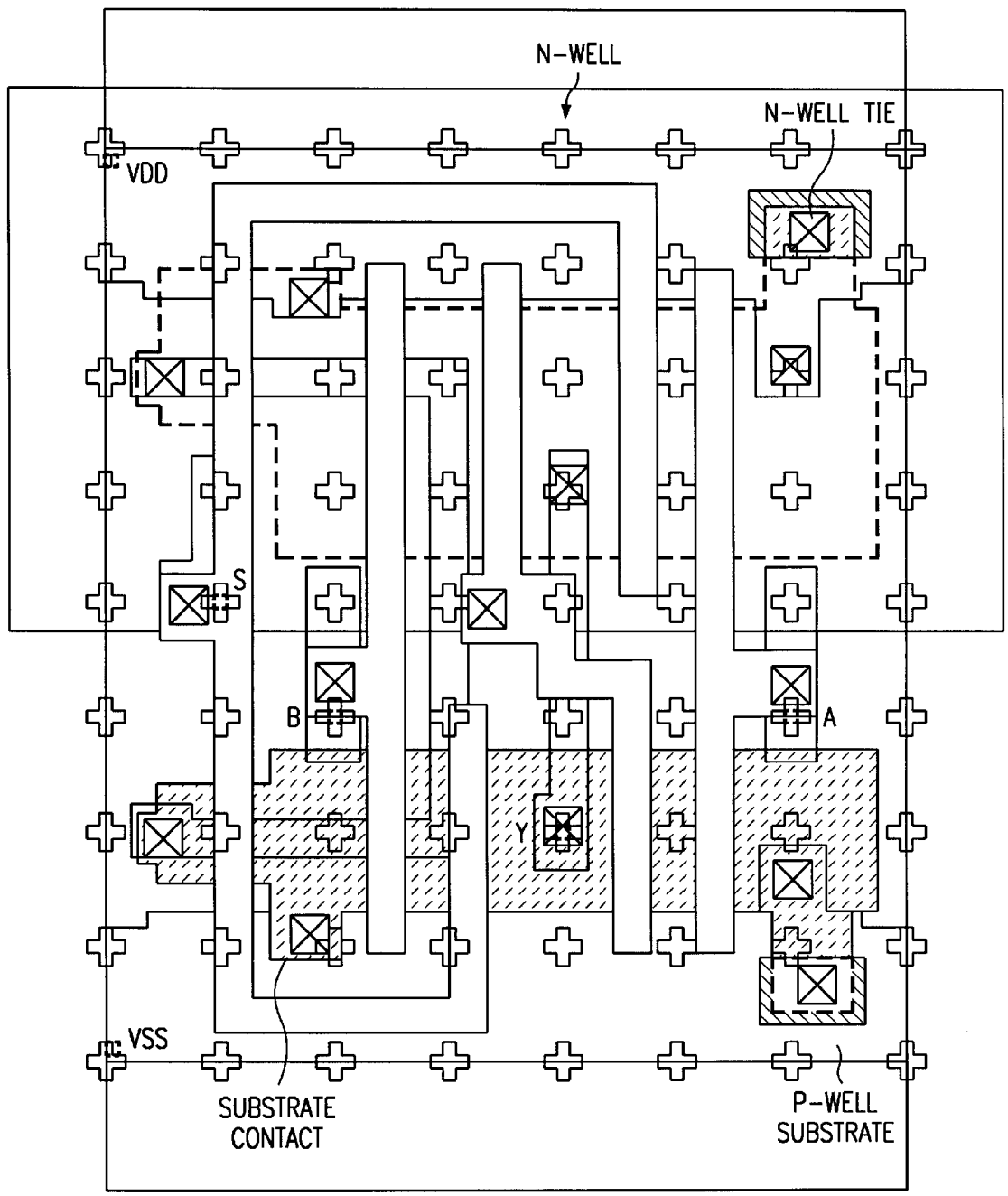
FIG. 6 illustrates a 1-1-2 input MUX (multiplexer) cell layout of a conventional standard cell library.

FIGS. 4, 5 and 6 illustrate layouts for three popular small cells and illustrate the placement of substrate contacts and well-ties in such cells. It is generally true that in the cell size range bracketed by these cells, namely 4, 5, or 6 tracks in size in their smallest direction, such cells could be reduced by at least one track in size (smallest direction) by elimination of substrate contacts and well-ties from the respective cell layouts. This gives potential for chip size reduction if the router and companion verification software could be reconfigured to re-add these substrate contacts and well-ties efficiently (only where absolutely necessary) at a higher architectural level rather than have them included in each small cell.

Three different approaches can be outlined for the placement and rule adherence with regard to substrate contacts and well-ties. The first two represent prior art approaches and the third represents the present invention.

Fixed Stripes of Substrate Contacts and Well-Ties placed at well defined periodic locations in the overall design layout (no exceptions).

Substrate Contacts and Well-Ties in every macro-cell layout. A macro-cell is defined as a netlist defined connection of low level basic standard cells.

Router Based Architectural Placement of Substrate Contacts and Well-Ties.

A) simplistic (one placement every n-grids).

B) intelligent (combining one placement every n-grids with placements inside cell layouts).

Figure 7:
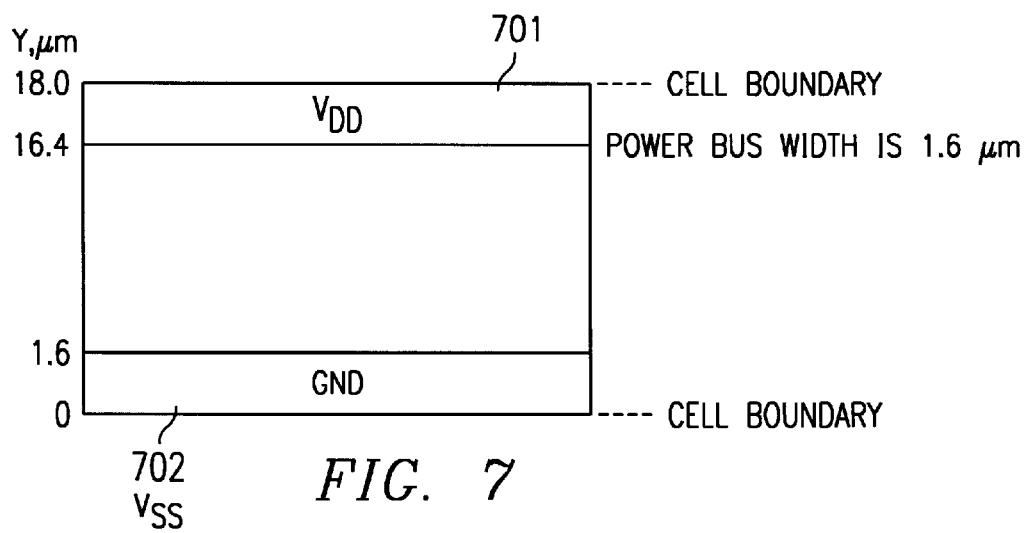
FIG. 7 illustrates an N-well region requiring well-ties to $V_{DD}$ and a P-well region common to the P-substrate region, which requires substrate contacts to $V_{SS}$ (ground)

This first approach is common among standard cell ASIC fabrication processes. It entails placing a stripe of well-ties or substrate contacts across the entire length of all cells. This approach is easy to automate and provides outstanding protection from latch-up which can occur whenever alternating P and N regions (not biased properly) can form a parasitic SCR (semiconductor controlled rectifier) structure. FIG. 7 illustrates the concept, in which the region 701 designated $V_{DD}$ is an N-well region requiring well-ties to $V_{DD}$ and region 702 designated $V_{SS}$ (ground) is a P-well region common to the P-substrate region, which requires substrate contacts. This first approach liberally places, at minimum spacing, the well-ties in region 701 and the substrate contacts in region 702. Analyses show that the typical investment in this liberal use (or over-use) of substrate contacts and well-tie contacts results in an increase in a total chip area of, perhaps 20%, when compared to what a hand crafted placement of these contacts within 'layout rule' requirements would yield.

The second approach relegates placement of substrate contacts and well-ties to the 'macro level' as an adjunct to such placements in the basic cells. Generally, this approach has an identifiable cost which comes statistically to about 8–10%.

The third approach listed above is the heart of this invention, namely a compromise which can take one of the two forms 'A' or 'B' listed above.

DETAILED DESCRIPTION OF THE INVENTION WITH REFERENCE TO THE DRAWINGS

Figure 8:
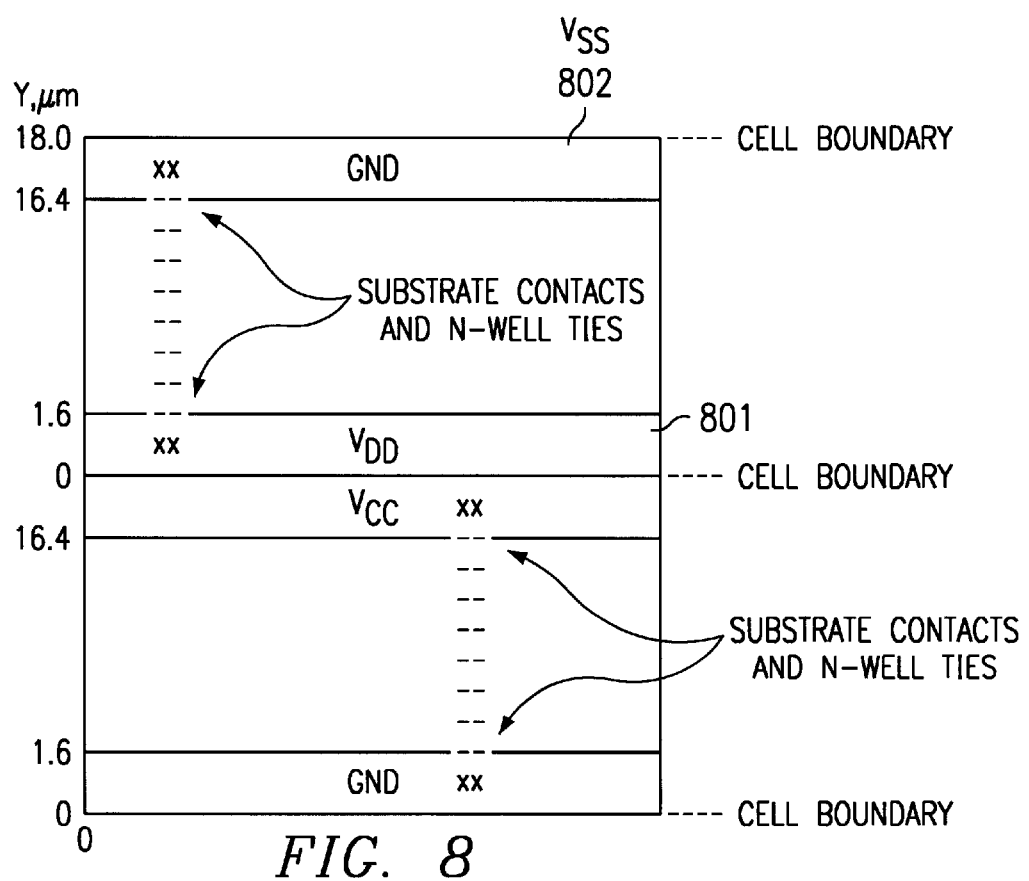
FIG. 8 illustrates two regions such as were illustrated in FIG. 7 but now placed in tandem to show only alternate locations along the x-direction with a 50 grid spacing.

The preferred embodiment of this invention is the form which uses a combination of 'intelligent placement' of substrate contacts and well-ties along with some embedding of such placements in the basic cell layouts. First, consider a second and less obtrusive version of the approach of this invention, namely the alternative embodiment which has been referred to as 'simplistic placement' of 1 substrate contact cell every n-grids. This is illustrated in FIG. 8 where two regions such as were illustrated in FIG. 7 are now placed in tandem to show only alternate locations along the x-direction with a 50 grid spacing. For a placement of substrate contacts and N-well ties about every 50 grids, the impact on layout size can be shown to be, on a statistical basis about 2% above the 'hand-crafted' layout size.

Finally, using the approach of the preferred embodiment of this invention, a decrease in layout size of 8–10% is realizable. The key elements of this preferred embodiment approach being as follows:

1. Design all cells of 4, 5, or 6 grids of width without internally placed well-ties or substrate contacts. All other cells have well-ties and substrate contacts wherever possible and always within the maximum spacing allowed by the layout rules. In cells such as flip-flops, it is possible to embed the well/sub contacts without causing growth of macro or diminished performance.

2. Have router detect when a macro-cell with embedded N-well and substrate contacts has been placed. No placements are to be introduced for another 50 microns linearly.

3. After determining basic placement of functional macros, have the place and route software insert well/substrate architectural cells to 'fix' any areas where the embedded sub/well ties do not meet the maximum spacing rules.

Figure 9:
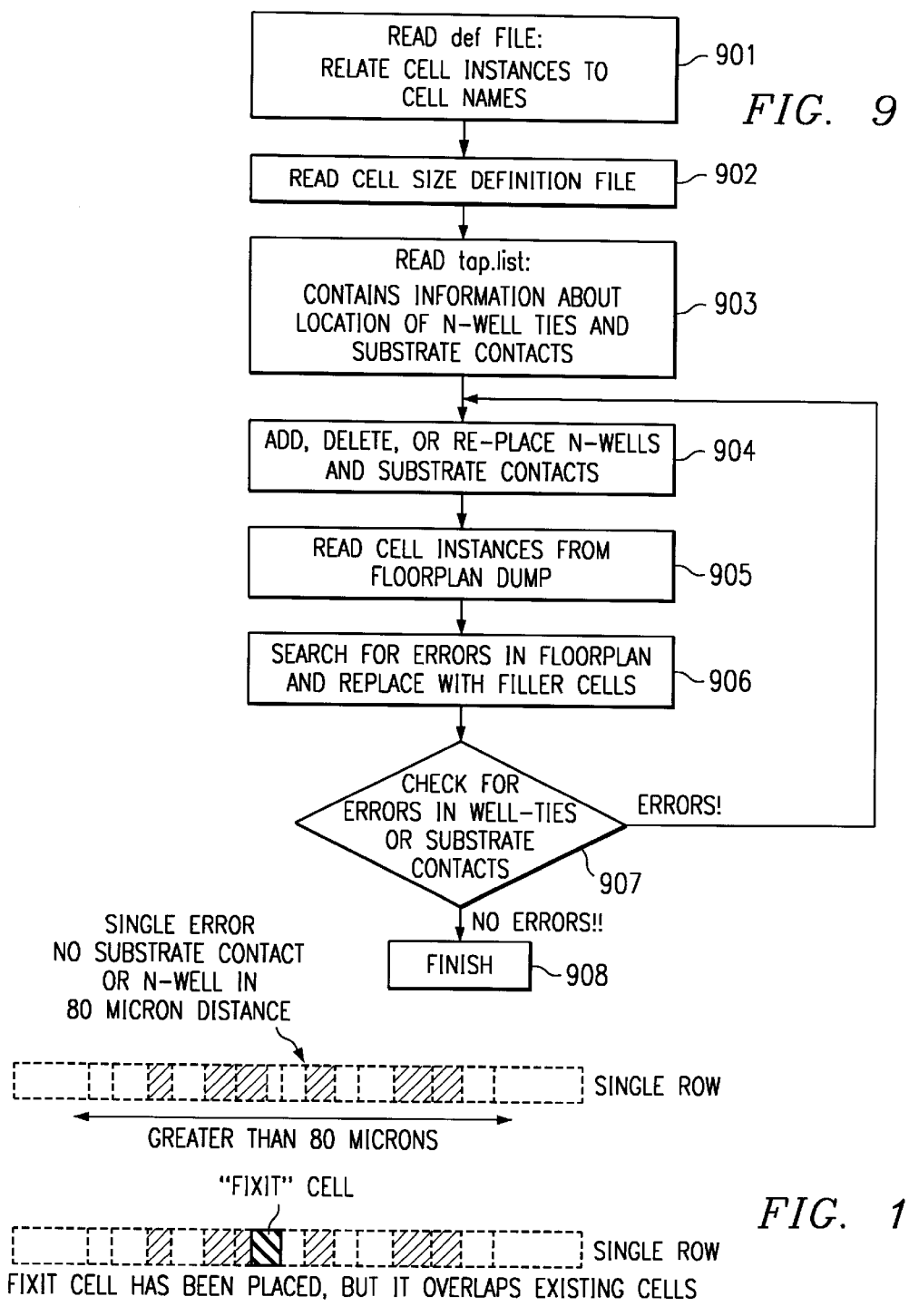
FIG. 9 flow diagram of the preferred embodiment of the methodology of this invention which illustrates the 'Fixit' flow which supplements the standard cell place-and-route software, and generates a greatly improved overall layout efficiency with regard to the placement of substrate contacts and well-ties when compared to a conventional ASIC standard cell layout approach.

A flow diagram is illustrated in FIG. 9. Prior to step 901, the ASIC standard cell place and route software is used to generate the computer data which uniquely describes the layout. The files 'def.file and 'tap.list' which are read in steps 901 and 903 are simple 'fetches' of available layout information generated by the place and route software tool. The portion of the flow 904, 905, 906 and 907 and the ensuing loop back to 904 comprise the essentials of the automatic well-tie and substrate contact placement of the preferred embodiment of the invention.

The Flow of FIG. 9 creates a batch file as an output from step 903, and the process of step 904 is to insert a 'Fixer' cell immediately between the two nearest cells which have an N-well tie. Since this is most likely on top of another cell, it is then necessary to relocate the other cells. This is accomplished by setting the status of the 'Fixer' cell and of all other cells between the two errors to 'rigid fixed' and then re-placing the entire area.

The preferred embodiment of the invention can be seen to include several possible ways to fix errors resulting from too much space between cells with N-well ties or substrate contacts. If the batch file generated in step 903 does not cover all corrections needed, then it will be necessary to correct it manually. The following are alternate techniques:

Place a 'filler' cell between the two cells with N-well ties and then place the area using a larger area than was used in the first pass flow.

Swap a problem cell (no N-well tie) with a cell from a row above or below which has an N-well tie.

Substitute for a problem cell (no N-well tie) with a cell having an N-well tie.

If there is no space between problem cells, they must be pulled apart and a 'Fixer' cell inserted between them.

Figure 10:
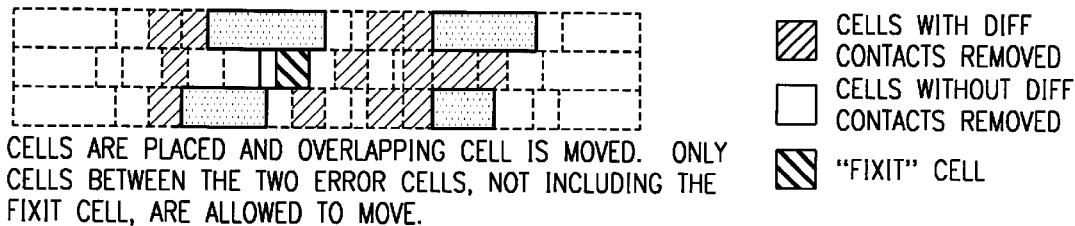
FIG. 10 illustrates pictorially the technique of this invention which provides for automatic placement and correction to placement of well-ties and substrate contacts.

Pictorially these steps can be viewed as implementing the 'Fixer' technique illustrated in FIG. 10.

In part A of FIG. 10, a single error situation is depicted, with a spacing of 80 microns (design rule maximum, 75 microns) between two cells having the required N-well tie and substrate contacts.

Part B of FIG. 10 illustrates a 'Fixit' cell placed but still in need of correction because of its overlap of existing cell placements.

Part C illustrates the final correction of the error, with the cell placement being adjusted to remove overlaps. Note only cells between the two error cells (not including the 'Fixit' cell) were allowed to move.

The steps may all be automated into a flow loop similar to that of steps 904, 905, 906 and 907 of FIG. 9, but with increased detail steps required.

What is claimed is:

1. A method for placement of substrate contacts and well-ties in a standard cell ASIC place and route flow comprising the steps of:

(1) generating a plurality of standard cells, said standard cells comprising first standard cells including substrate contacts and/or well-ties and second standard cells not including substrate contacts and/or well-ties;

(2) preliminarily placing a plurality of said standard cells for interconnection among said standard cells for a desired circuit function;

(3) detecting where said preliminary placing of said standard cells violates a maximum spacing rule for substrate contacts;

(4) replacing standard cells to remedy any detected violation of said maximum spacing rule for substrate contacts;

(5) detecting where said preliminary placing of said standard cells violates a maximum spacing rule for well-ties;

(6) replacing standard cells to remedy any detected violation of said maximum spacing rule for well-ties;

(7) repeating steps (3) to (6) until no violations of either said maximum spacing rule for substrate contacts or said maximum spacing rule for well-ties is detected.

2. The method of claim 1, wherein:

said step of generating a plurality of standard cells includes generating a filler substrate contact cell having a substrate contact and generating a filler well-tie standard cell having a well-tie;

said step (4) of replacing said standard cells includes placing a filler substrate contact standard cell between two substrate contacts violating said maximum spacing rule for substrate contacts; and said step (6) of replacing said standard cells includes placing a filler well-tie standard cell between two well-ties violating said-maximum spacing rule for well-ties.

3. The method of claim 1, wherein:

said step (4) of replacing said standard cells includes substituting a first standard cell with a substrate contact for a second standard cell without a substrate contact; and said step (6) of replacing said standard cells includes substituting a first standard cell with a well-tie for a standard cell without a well-tie.

4. The method of claim 1, wherein:

said step (4) of replacing said standard cells includes swapping a first standard cell with a substrate contact with an adjacent second standard cell without a substrate contact; and said step (6) of replacing said standard cells includes swapping a first standard cell with a well-tie with an adjacent second standard cell without-a well-tie.

5. The method of claim 4, wherein:

said step of preliminarily placing a plurality of said standard cells includes disposing said standard cells in rows;

said step swapping a first standard cell with a substrate contact with an adjacent second standard cell without a substrate contact whereby said first standard cell without a substrate contact is disposed in a row above or below said second standard cell without a substrate contact; and said step swapping a first standard cell with a well-tie with an adjacent second standard cell without a well-tie whereby said first standard cell without a well-tie is disposed in a row above or below said second standard cell without a well-tie.

6. A method for placement of substrate contacts in a standard cell ASIC place and route flow comprising the steps of:

(1) generating a plurality of standard cells, said standard cells comprising first standard cells including substrate contacts and second standard cells not including substrate contacts;

(2) preliminarily placing a plurality of standard cells for interconnection among said standard cells for a desired circuit function;

(3) detecting where said preliminary placing of said standard cells violates a maximum spacing rule for substrate contacts;

(4) replacing said standard cells to remedy any detected violation of said maximum spacing rule for substrate contacts;

(5) repeating steps (3) and (4) until no violations of said maximum spacing rule for substrate contacts is detected.

7. The method of claim 6, wherein:

said step of generating a plurality of standard cells includes generating a filler substrate contact cell having a substrate contact;

said step (4) of replacing said standard cells includes placing a filler substrate contact standard cell between two substrate contacts violating said maximum spacing rule for substrate contacts.

8. The method of claim 6, wherein:

said step (4) of replacing said standard cells includes substituting a first standard cell with a substrate contact for a second standard cell without a substrate contact.

9. The method of claim 6, wherein:

said step (4) of replacing said standard cells includes swapping a first standard cell with a substrate contact with an adjacent second standard cell without a substrate contact.

10. The method of claim 9, wherein:

said step of preliminarily placing a plurality of said standard cells includes disposing said standard cells in rows; and said step swapping a first standard cell with a substrate contact with an adjacent second standard cell without a substrate contact whereby said first standard cell without a substrate contact is disposed in a row above or below said second standard cell without a substrate contact.

11. A method for placement of well-ties in a standard cell ASIC place and route flow comprising the steps of:

(1) generating a plurality of standard cells, said standard cells comprising first standard cells including well-ties and second standard cells not including well-ties;

(2) preliminarily placing a plurality of standard cells for interconnection among said standard cells for a desired circuit function;

(3) detecting where said preliminary placing of said standard cells violates a maximum spacing rule for well-ties;

(4) replacing said standard cells to remedy any detected violation of said maximum spacing rule for well-ties;

(5) repeating steps (3) and (4) until no violations of said maximum spacing rule for well-ties is detected.

12. The method of claim 11, wherein:

said step of generating a plurality of standard cells includes generating a filler substrate contact cell having a substrate contact and generating a filler well-tie standard cell having a well-tie;

said step (4) of replacing said standard cells includes placing a filler well-tie standard cell between two well-ties violating said maximum spacing rule for well-ties.

13. The method of claim 11, wherein:

said step (4) of replacing said standard cells includes substituting a first standard cell with a well-tie for a second standard cell without a well-tie.

14. The method of claim 11, wherein:

said step (4) of replacing said standard cells includes swapping a first standard cell with a well-tie with an adjacent second standard cell without a well-tie.

15. The method of claim 14, wherein:

said step of preliminarily placing a plurality of said standard cells includes disposing said standard cells in rows; and said step swapping a first standard cell with a well-tie with an adjacent second standard cell without a well-tie whereby said first standard cell without a well-tie is disposed in a row above or below said second standard cell without a well-tie.

* * * * *